United States Patent
Lubguban et al.

(10) Patent No.: US 12,334,461 B2
(45) Date of Patent: Jun. 17, 2025

(54) BONDING STRUCTURE USING TWO OXIDE LAYERS WITH DIFFERENT STRESS LEVELS, AND RELATED METHOD

(71) Applicant: GlobalFoundries U.S. Inc., Malta, NY (US)

(72) Inventors: Jorge A. Lubguban, Danbury, CT (US); Sarah H. Knickerbocker, Poughkeepsie, NY (US); Lloyd Burrell, Poughkeepsie, NY (US); John J. Garant, Poughkeepsie, NY (US); Matthew C. Gorfien, Saratoga Springs, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 506 days.

(21) Appl. No.: 17/929,790

(22) Filed: Sep. 6, 2022

(65) Prior Publication Data
US 2024/0079360 A1  Mar. 7, 2024

(51) Int. Cl.
*H01L 23/48* (2006.01)
*H01L 23/00* (2006.01)
(Continued)

(52) U.S. Cl.
CPC .............. *H01L 24/08* (2013.01); *H01L 24/05* (2013.01); *H01L 24/80* (2013.01);
(Continued)

(58) Field of Classification Search
CPC ....... H01L 2224/32145; H01L 25/0657; H01L 2224/16145; H01L 2224/16227; H01L 21/2007; H01L 25/0655; H01L 2224/08145; H01L 24/05; H01L 2224/80001; H01L 25/0652; H01L 2021/60067; H01L 2224/04042; H01L 2224/83203; H01L 2225/06544;
(Continued)

(56) References Cited

U.S. PATENT DOCUMENTS

| | | |
|---|---|---|
| 9,142,532 B2 | 9/2015 | Suga et al. |
| 2004/0126993 A1 | 7/2004 | Chan et al. |

(Continued)

FOREIGN PATENT DOCUMENTS

| | | |
|---|---|---|
| CN | 108461512 A | 8/2018 |
| KR | 100945800 B1 | 3/2010 |

OTHER PUBLICATIONS

Office Action for German Application 102023120847.0; pp. 13.

*Primary Examiner* — Niki H Nguyen
(74) *Attorney, Agent, or Firm* — Francois Pagette; Hoffman Warnick LLC

(57) ABSTRACT

A bonding structure for a semiconductor substrate and related method are provided. The bonding structure includes a first oxide layer on the semiconductor substrate, and a second oxide layer on the first oxide layer, the second oxide layer for bonding to another structure. The second oxide layer has a higher stress level than the first oxide layer, and the second oxide layer is thinner than the first oxide layer. The second oxide layer may also have a higher density than the first oxide layer. The bonding structure can be used to bond chips to wafer or wafer to wafer and provides a greater bond strength than just a thick oxide layer.

20 Claims, 15 Drawing Sheets

(51) Int. Cl.
*H01L 23/52* (2006.01)
*H01L 29/40* (2006.01)
(52) U.S. Cl.
CPC ............... *H01L 2224/05647* (2013.01); *H01L 2224/08145* (2013.01); *H01L 2224/80379* (2013.01); *H01L 2224/80895* (2013.01); *H01L 2224/80896* (2013.01)
(58) Field of Classification Search
CPC ....... H01L 25/0756; H01L 2224/48145; H01L 25/072; H01L 2224/81203; H01L 2224/80905; H01L 24/08; H01L 24/80; H01L 2224/05647; H01L 2224/80379; H01L 2224/80895; H01L 2224/80896
See application file for complete search history.

(56) References Cited

U.S. PATENT DOCUMENTS

2006/0032582 A1  2/2006  Chen et al.
2019/0096830 A1* 3/2019  Wei ....................... H10F 39/024

\* cited by examiner

BONDING STRUCTURE USING TWO OXIDE LAYERS WITH DIFFERENT STRESS LEVELS, AND RELATED METHOD

BACKGROUND

The present disclosure relates to integrated circuit (IC) fabrication, and more particularly, to a structure and method of bonding structures, such as chips to wafers or wafer to wafers, using two oxide layers to provide improved bond strength.

Chip to wafer and wafer to wafer bonding has the potential to improve performance of a wide variety of silicon technologies. Achieving a bond with sufficient bond strength with low stress and high density thin films is a challenge. One approach forms a thick oxide (e.g., 1000-15000 nanometers) at a low deposition temperature for bonding with another wafer. The low deposition temperature prevents damage to devices on the substrate but provides a low density and low stress layer with insufficient bond strength. Where the thick layer is made denser, the wafer bond strength is increased, but the stress is unacceptably high. Other approaches treat the surface of the wafer with ammonia to enhance the bond strength. Additional approaches have tried bonding at elevated temperatures and applying pressure or using a water plasma treatment on the surface. These approaches do not provide sufficient bond strength, and/or can damage preexisting devices.

SUMMARY

All aspects, examples and features mentioned below can be combined in any technically possible way.

An aspect of the disclosure provides a bonding structure for a semiconductor substrate, the bonding structure comprising: a first oxide layer on the semiconductor substrate; and a second oxide layer on the first oxide layer, the second oxide layer for bonding to another structure, wherein the second oxide layer has a higher stress level than the first oxide layer, and the second oxide layer is thinner than the first oxide layer.

Another aspect of the disclosure includes any of the preceding aspects, and the second oxide layer has a higher density than the first oxide layer.

An aspect includes a semiconductor device, comprising: a semiconductor substrate; and a first bonding structure between the semiconductor substrate and a first structure, the first bonding structure including: a first oxide layer on the semiconductor substrate, and a second oxide layer on the first oxide layer coupled to the first structure, wherein the second oxide layer has a higher stress level than the first oxide layer, and the second oxide layer is thinner than the first oxide layer.

Another aspect of the disclosure includes any of the preceding aspects, and the second oxide layer has a higher density than the first oxide layer.

Another aspect of the disclosure includes any of the preceding aspects, and the first oxide layer has a density in a range of 2.31-2.37 grams per cubic centimeter ($g/cm^3$), and the second oxide layer has a density in a range of 2.43-2.52 $g/cm^3$.

Another aspect of the disclosure includes any of the preceding aspects, and further comprising a second bonding structure for bonding a second structure to the first structure, wherein the second bonding structure includes: a third oxide layer on the first structure, and a fourth oxide layer on the third oxide layer, wherein the fourth oxide layer has a higher density and a higher stress level than the third oxide layer, and the fourth oxide layer is thinner than the third oxide layer.

Another aspect of the disclosure includes any of the preceding aspects, and the first oxide layer has a thickness in a range of 5000 to 15000 nanometers (nm), and the second oxide layer has a thickness in a range of 250 to 750 nm.

Another aspect of the disclosure includes any of the preceding aspects, and the first oxide layer has a compressive stress in a range of 70-100 MegaPascals (MPa), and the second oxide layer has a compressive stress in a range of 300-350 MPa.

Another aspect of the disclosure includes any of the preceding aspects, and at least one of the first oxide layer and the second oxide layer has a surface having a root mean square roughness in a range of 0.1 to 0.5 nanometers.

Another aspect of the disclosure includes any of the preceding aspects, and a bond strength between the second oxide layer and the first structure is at least 1.0 Joules per square meter ($J/m^2$).

An aspect of the disclosure includes a method, comprising: forming a first bonding structure, the forming including: forming a first oxide layer on a first structure; forming a second oxide layer on the first oxide layer, wherein the second oxide layer has a higher stress level than the first oxide layer, and the second oxide layer is thinner than the first oxide layer; and bonding the second oxide layer to a second structure.

Another aspect of the disclosure includes any of the preceding aspects, and the second oxide layer has a higher density than the first oxide layer.

Another aspect of the disclosure includes any of the preceding aspects, and the first oxide layer has a density in a range of 2.31-2.37 grams per cubic centimeter ($g/cm^3$), and the second oxide layer has a density in a range of 2.43-2.52 $g/cm^3$.

Another aspect of the disclosure includes any of the preceding aspects, and forming the first oxide layer and forming the second oxide layer each occur at a temperature of less than 300° Celsius (° C.).

Another aspect of the disclosure includes any of the preceding aspects, and forming the first oxide layer includes depositing the first oxide layer to a thickness in a range of 5 to 15 µm, and wherein forming the second oxide layer includes depositing the second oxide layer to a thickness in a range of 0.25 to 0.75 µm.

Another aspect of the disclosure includes any of the preceding aspects, and the first oxide layer has a compressive stress in a range of 70-100 MPa, and the second oxide layer has a compressive stress in a range of 300-350 MPa.

Another aspect of the disclosure includes any of the preceding aspects, and at least one of forming the first oxide layer and forming the second oxide layer includes planarizing a surface of the respective oxide layer to have a root mean square roughness in a range of 0.1 to 0.5 nanometers.

Another aspect of the disclosure includes any of the preceding aspects, and a bond strength between the second oxide layer and the first structure is at least 1.6 $J/m^2$.

Another aspect of the disclosure includes any of the preceding aspects, and further comprising: forming a second bonding structure on the second structure, including: forming a third oxide layer on the second structure, and forming a fourth oxide layer on the third oxide layer, wherein the fourth oxide layer has a higher density and a higher stress level than the third oxide layer, and the fourth oxide layer is thinner than the third oxide layer; and bonding a third structure to the fourth oxide layer.

Another aspect of the disclosure includes any of the preceding aspects, and forming the third oxide layer includes depositing the third oxide layer to a thickness in a range of 5 to 15 μm, and forming the fourth oxide layer includes depositing the fourth oxide layer to a thickness in a range of 0.25 to 0.75 μm.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
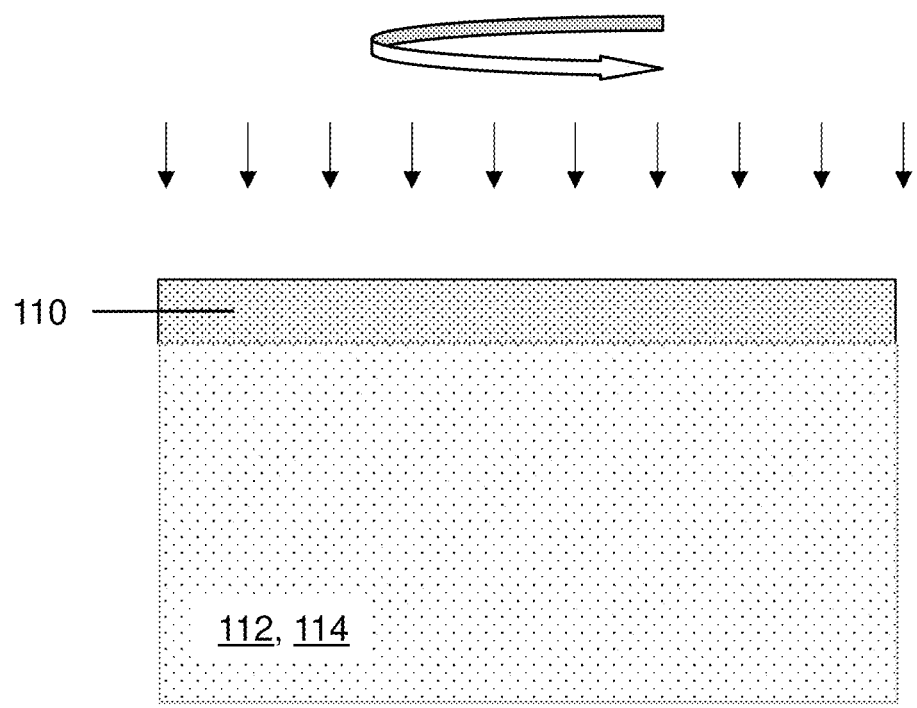
FIG. 1 shows a cross-sectional view of forming a first oxide layer of a first bonding structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a bonding structure for a semiconductor substrate and a related method. The bonding structure includes a first oxide layer on the semiconductor substrate, and another, second oxide layer on the first oxide layer, where the second oxide layer bonds to another structure, e.g., another substrate (wafer) or chips. The bonding structure can be used to bond chips to wafer, or wafer to wafer, with or without conductor-to-conductor features. In any event, the second oxide layer has a higher stress level than the first oxide layer, and the second oxide layer is thinner than the first oxide layer. The second oxide layer may also have a higher density than the first oxide layer. One or more of the bonding structures can be used in a single device. The bonding structure provides a greater bond strength than just a thick oxide layer, e.g., at least 1.0 Joules per square meter ($J/m^2$) compared to about 0.6 $J/m^2$ of a conventional thick oxide bonding layer. In other embodiments, the bond strength may be at least 1.6 $J/m^2$. The bonding structure is free of voids therein. The process to form the bonding structure does not require tool modifications. Each oxide forming step uses low temperatures that do not damage pre-existing devices. While the disclosure will be described relative to oxide layers, the teachings of the disclosure are equally applicable to layers of silicon carbo-nitride (SiCN).

Figure 2:
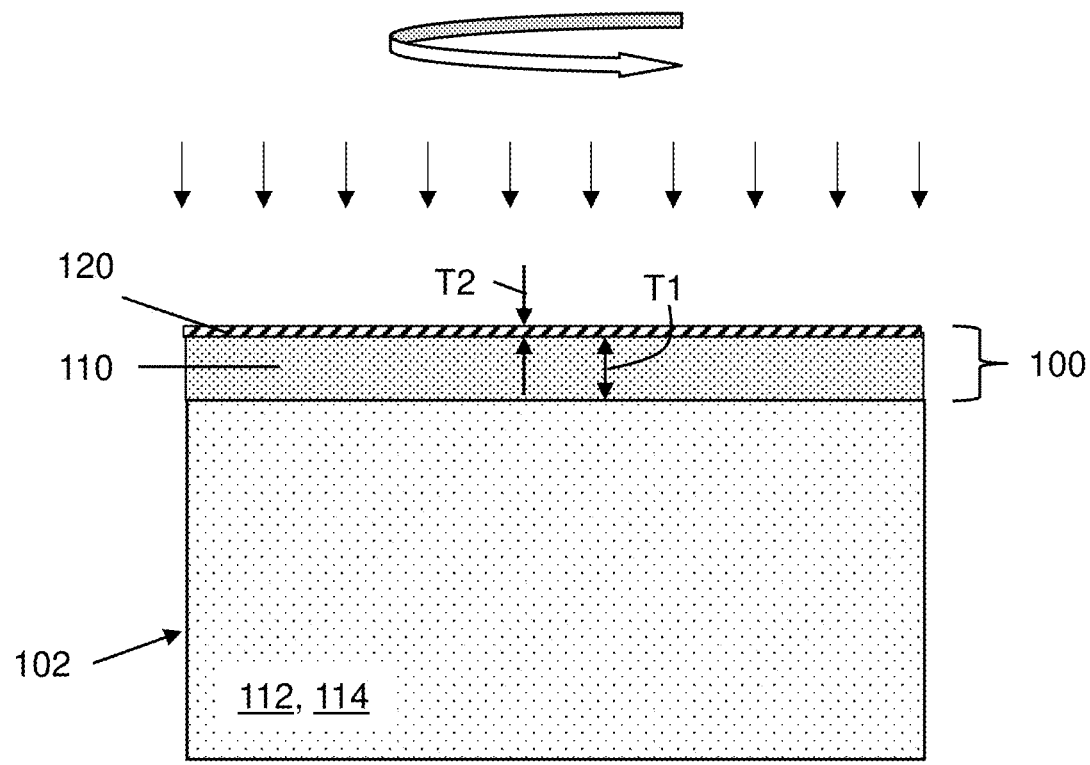
FIG. 2 shows a cross-sectional view of forming a second oxide layer of a first bonding structure, according to embodiments of the disclosure.

FIGS. 1-2 show cross-sectional views of a method for forming a first bonding structure 100 (FIG. 2), according to embodiments of the disclosure. FIGS. 1-2 show forming of first bonding structure 100 in a generic manner that is applicable to a variety of applications. As will be described further herein, first bonding structure 100 (hereafter "bonding structure 100") can be used in a number of semiconductor fabrication situations to increase bond strength in, for example, chips to wafer and/or wafer to wafer settings.

FIG. 1 shows forming a first oxide layer 110 on a first structure 112. In the example shown, first structure 112 may include a semiconductor substrate 114, which may be referred to as a handle wafer in some cases. As used herein, any semiconductor substrate (e.g., substrate 114) may include, for example, a silicon or silicon-based substrate (e.g., a silicon carbide (SiC) substrate or other material that support epitaxial growth of semiconductor), a sapphire substrate, or any other suitable substrate for a III-V semiconductor device. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). The substrate may include or be devoid of devices (not shown), e.g., transistors or related passive devices such as capacitors, resistors, etc. The terms 'wafer' and 'substrate' may be used interchangeably herein.

First oxide layer 110 may be formed using, for example, silane-based ($SiH_4$) plasma enhanced chemical vapor deposition (PECVD), creating a silicon oxide ($SiO_x$). A gas ratio of silicon hydride ($SiH_4$) to nitrous oxide ($N_2O$) of the PECVD may be in a range of, for example, 1:25 to 1:35. In any event, the temperature of the PECVD is less than 300° Celsius (° C.), which protects any preexisting devices, e.g., transistors in semiconductor substrate 114, from thermally induced damage. First oxide layer 110 may be deposited to a thickness in a range of 5000 to 15000 nanometers (nm). First oxide layer 110 deposition can occur at a rate in a range of, for example, 350-500 nanometers per minute (nm/min). When complete, first oxide layer 110 may have a density in a range of 2.31-2.37 grams per cubic centimeter ($g/cm^3$). First oxide layer 110 has a relatively low compressive stress in a range of, for example, 70-100 MegaPascals (MPa). First oxide layer 110 may have a dielectric constant in a range of, for example, 4.7 to 6.0.

As part of its forming, first oxide layer 110 may be planarized using any now known or later developed planarization process such as but not limited to chemical mechanical polishing (CMP) (indicated by curved arrow). In certain embodiments, a surface of first oxide layer 110 has a root mean square (RMS) roughness in a range of 0.1-0.5 nanometers (nm).

FIG. 2 shows forming a second oxide layer 120 on first oxide layer 110, creating bonding structure 100. As will be described, second oxide layer 120 has a higher stress level than first oxide layer 110. For example, in contrast to first oxide layer 110, second oxide layer 120 may have a relatively high compressive stress in a range of, for example, 300-350 MPa. Second oxide layer 120 may also have a higher density than first oxide layer 110. Further, as shown, second oxide layer 120 is thinner than first oxide layer 110, e.g., T2<T1. Second oxide layer 120 may be deposited to a thickness in a range of 0.25 to 0.75 μm. Second oxide layer 120 may be formed using, for example, silane-based ($SiH_4$) PECVD, creating a silicon oxide ($SiO_x$).

Forming second oxide layer 120 uses a higher concentration of the silane than forming first oxide layer 110. In addition, a gas ratio of silicon hydride ($SiH_4$) to nitrous oxide ($N_2O$) of the PECVD may be in a range of, for example, 1:200 to 1:250. In any event, the temperature of the PECVD for second oxide layer 120 is less than 300° C., which continues to protect any preexisting devices, e.g., in semiconductor substrate 114, from thermally induced damage. Second oxide layer 120 deposition can occur at a rate in a range of, for example, 800-1000 Å/min. The duration of depositing second oxide layer 120 thus could be longer than that first oxide layer 110 even though layer 120 is thinner than layer 110. When complete, second oxide layer 120 may have a density in a range of 2.43-2.52 $g/cm^3$. Second oxide layer 120 may have a dielectric constant in a range of, for example, 4.0 to 4.5. Due to the higher density in second oxide layer 120, when second oxide layer 120 is used to bond to another structure, a bond strength between second oxide layer 120 and the bonded structure is higher than conventionally possible with a single thick oxide layer. In certain embodiments, the bond strength may be at least 1.0 $J/m^2$. In other embodiments, the bond strength may be at least 1.6 $J/m^2$. The bond strength of bond structure 100 is thus significantly stronger than that possible with a conventional single thick oxide layer bonding structure, which typically has a bond strength of about 0.6 $J/m^2$. Bonding structure 100 may include any now known or later developed alignment marks (not shown) for aligning other structure thereto. As will be described, hybrid bond pads may be formed through bonding structure 100.

As part of its forming, second oxide layer 120 may be planarized using any now known or later developed planarization process such as but not limited to CMP (indicated by curved arrow). In certain embodiments, a surface of second oxide layer 120 has an RMS roughness in a range of 0.1-0.5 nm.

Figure 3:
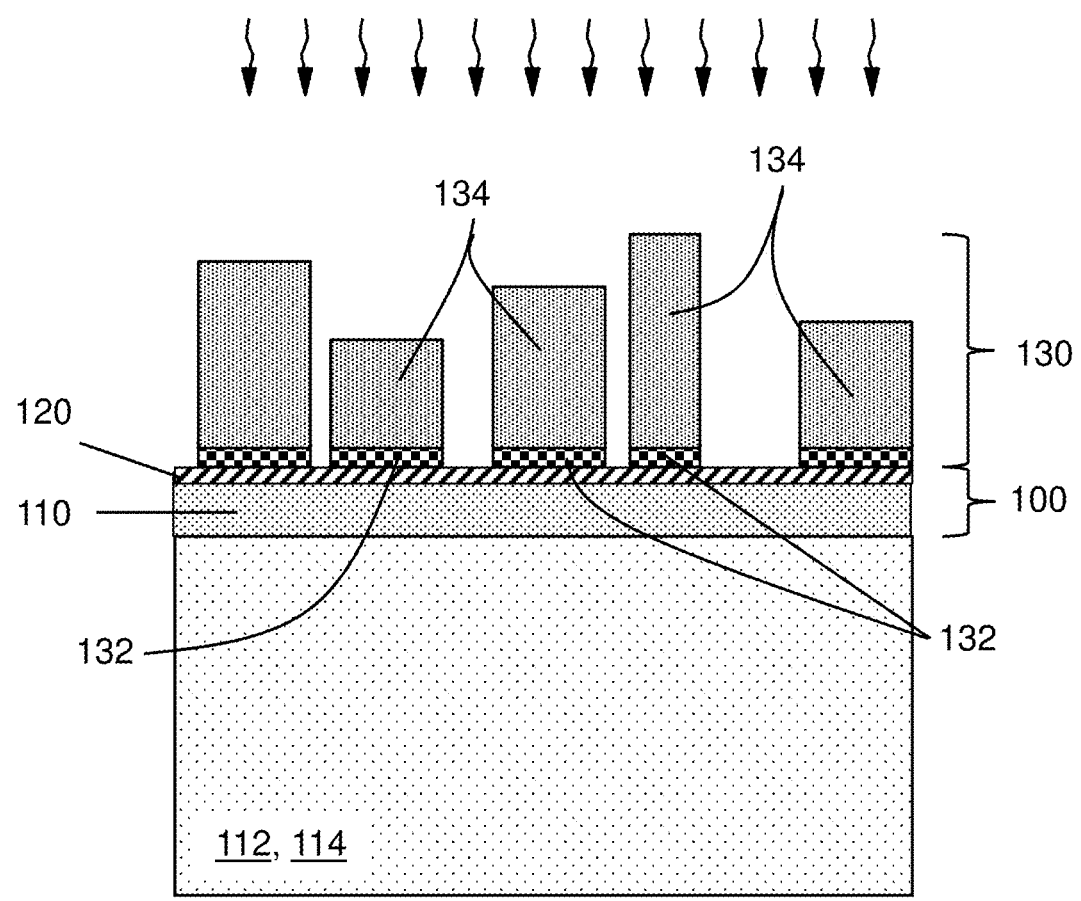
FIG. 3 shows a cross-sectional view of bonding a structure in the form of IC chips to another structure using the first bonding structure, according to embodiments of the disclosure.

FIG. 2 shows bonding structure 100 for a semiconductor substrate 114 and a semiconductor device 102, according to embodiments of the disclosure. Bonding structure 100 includes first oxide layer 110 on semiconductor substrate 114 and second oxide layer 120 on first oxide layer 110. Second oxide layer 120 can be used to bond to another structure, e.g., as shown in FIG. 3, a second structure 130 including IC chips 132. Second oxide layer 120 has a higher stress level than first oxide layer 110. For example, in contrast to first oxide layer 110 having compressive stress of, for example, 70-100 MPa, second oxide layer 120 may have a relatively high compressive stress in a range of, for example, 300-350 MPa. Second oxide layer 120 may also have a higher density than first oxide layer 110. In addition, second oxide layer 120 is thinner than first oxide layer 110. For example, first oxide layer 110 may have a thickness in a range of 5 to 15 μm, and second oxide layer 120 may have a thickness in a range of 0.25 to 0.75 μm.

FIGS. 3-15 show cross-sectional views of various ways to use bonding structure 100, according to embodiments of the disclosure.

Figure 4:
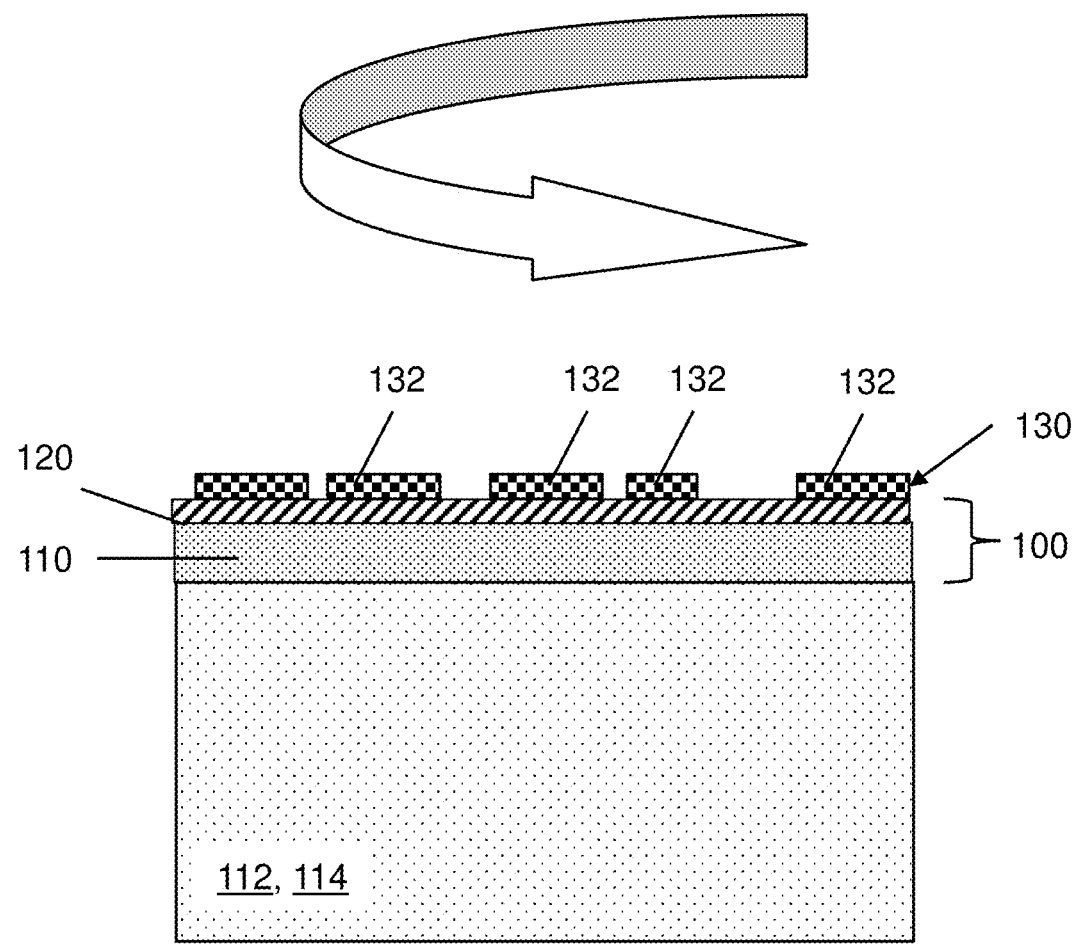
FIG. 4 shows a cross-sectional view of planarizing the IC chips using the first bonding structure, according to embodiments of the disclosure.

FIGS. 3-4 show cross-sectional views of one way to use bonding structure 100. Notably, FIG. 3 shows bonding second oxide layer 120 of bonding structure 100 to a second structure 130. In this example, second structure 130 includes a plurality of integrated circuit (IC) chips 132, each having a dielectric layer 134 (e.g., silicon oxide or silicon nitride) thereover, which may extend to various thicknesses. Second structure 130 can be provided in any now known or later developed manner for bonding to structure 100, e.g., tape release, die on tape frame or die picked from die pack. Once in position, an anneal (curved arrows in FIG. 3) can be carried out on structures 100, 130. As shown in FIG. 4, a planarization (e.g., CMP) of dielectric layer 134 may then occur. Bonding structure 100 provides sufficient bond strength to prevent IC chips 132 removal during the planarization process.

Figure 5:
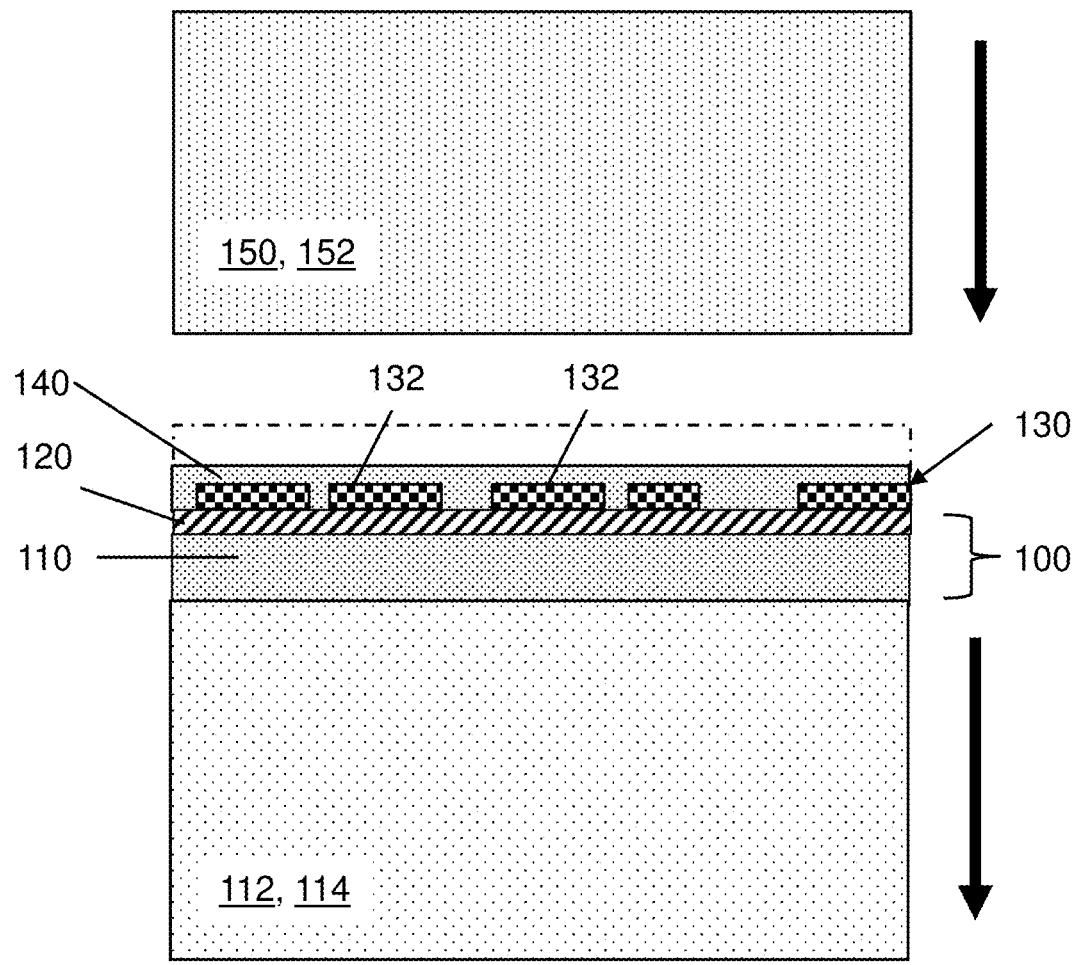
FIG. 5 shows a cross-sectional view of bonding a structure to the IC chips after depositing another thick oxide layer to encapsulate the IC chips and removing another structure, according to embodiments of the disclosure.
Figure 6:
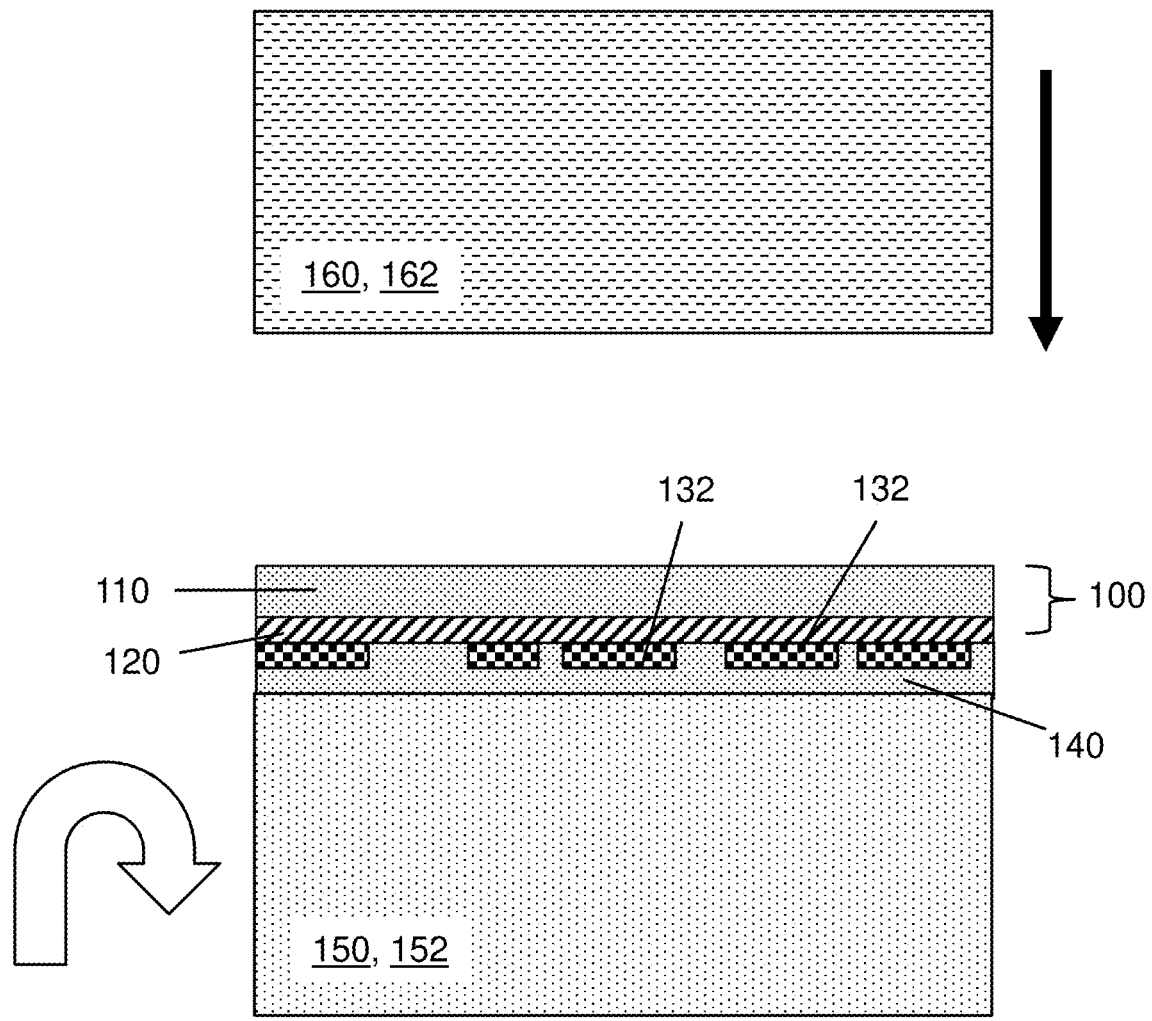
FIG. 6 shows a cross-sectional view of bonding another structure to the structure of FIG. 5 after rotation thereof, according to embodiments of the disclosure.
Figure 7:
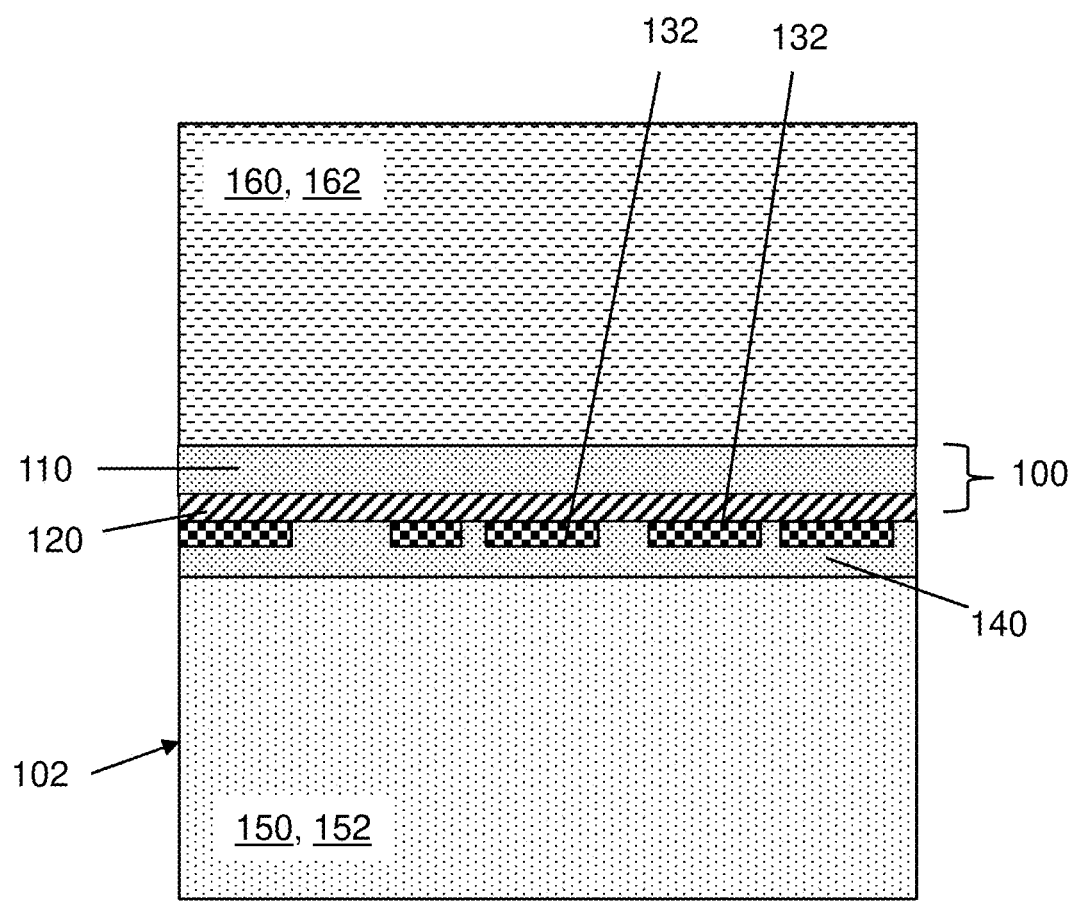
FIG. 7 shows a cross-sectional view of a semiconductor device using the first bonding structure, according to embodiments of the disclosure.

FIGS. 5-7 show cross-sectional views of another way to use bond structure 100. FIG. 5 shows forming a third oxide layer 140 over second structure 130 (as in FIG. 4). Third oxide layer 140 may be formed using processes as described herein relative to first oxide layer 110. Third oxide layer 140 may be formed using, for example, silane-based (SiH$_4$) PECVD, creating a silicon oxide (SiO$_x$). A gas ratio of silicon hydride (SiH$_2$) to nitrous oxide (N$_2$O) of the PECVD may be in a range of, for example, 1:25 to 1:35. In any event, the temperature of the PECVD is less than 300° C., which protects any preexisting devices such as IC chips 132 from thermal damage. Third oxide layer 140 may be deposited to a thickness in a range of 5 to 15 μm and may encapsulate IC chips 132 of second structure 130. Third oxide layer 140 deposition can occur at a rate in a range of, for example, 3500-5000 Å/min. When complete, third oxide layer 140 may have a density in a range of 2.31-2.37 g/cm$^3$. Third oxide layer 140 has a relatively low compressive stress in a range of, for example, 70-100 MPa. Third oxide layer 140 may have a dielectric constant in a range of, for example, 4.7 to 6.0. Once formed, third oxide layer 140 may be planarized (see planarizing and thinning indicated by dashed boxed in FIG. 5) using any now known or later developed processes, e.g., CVD layer planarization and/or CMP.

As shown in FIG. 5, in certain embodiments, a third structure 150 may then be bonded to third oxide layer 140—see upper arrow in FIG. 5. In the example shown, third structure 150 may include a semiconductor substrate 152, which may include any form of integrated circuit devices and/or interconnect structures, e.g., additional transistors, metal wires and contacts, etc. Semiconductor substrate 152 may include any semiconductor material such as silicon, silicon germanium, silicon carbide, etc., and may include or be devoid of semiconductor devices (not shown). First structure 112 may then be removed using any now known or later developed technique, which may thin first oxide layer 110.

FIG. 6 shows the structure after rotating second structure 150, as in FIG. 5, to be under bonding structure 100. FIGS. 6 and 7 show bonding a fourth structure 160 to third structure 150 using bonding structure 100. Here, first oxide layer 110 of bonding structure 100 bonds to fourth structure 160. In the example shown, fourth structure 160 may include a substrate 162, which may include, for example, any form of interconnect structures such as metal wires and contacts, etc.

Figure 8:
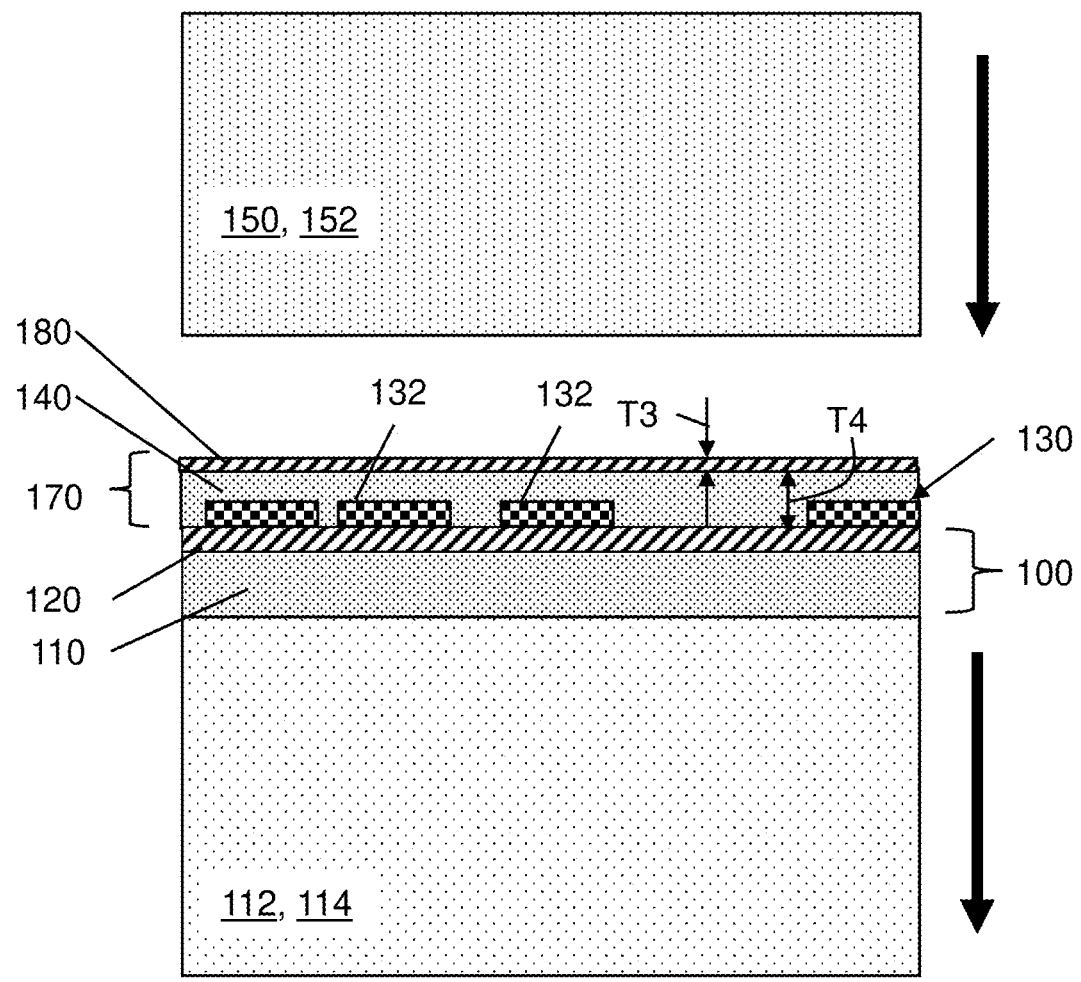
FIG. 8 shows a cross-sectional view of forming a second bonding structure, according to embodiments of the disclosure.
Figure 9:
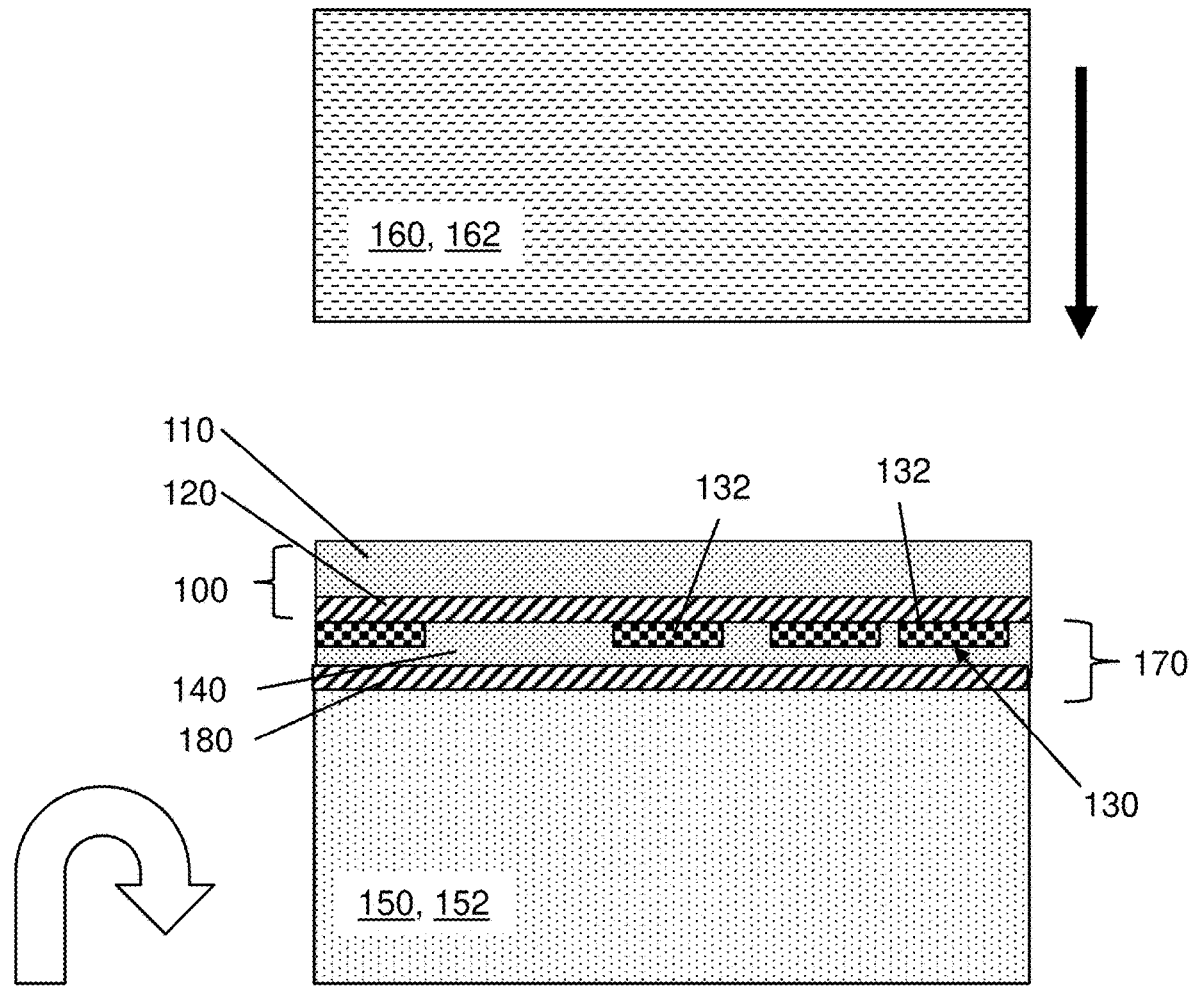
FIG. 9 shows a cross-sectional view of bonding another structure to the structure of FIG. 8 after rotation thereof, according to embodiments of the disclosure.
Figure 10:
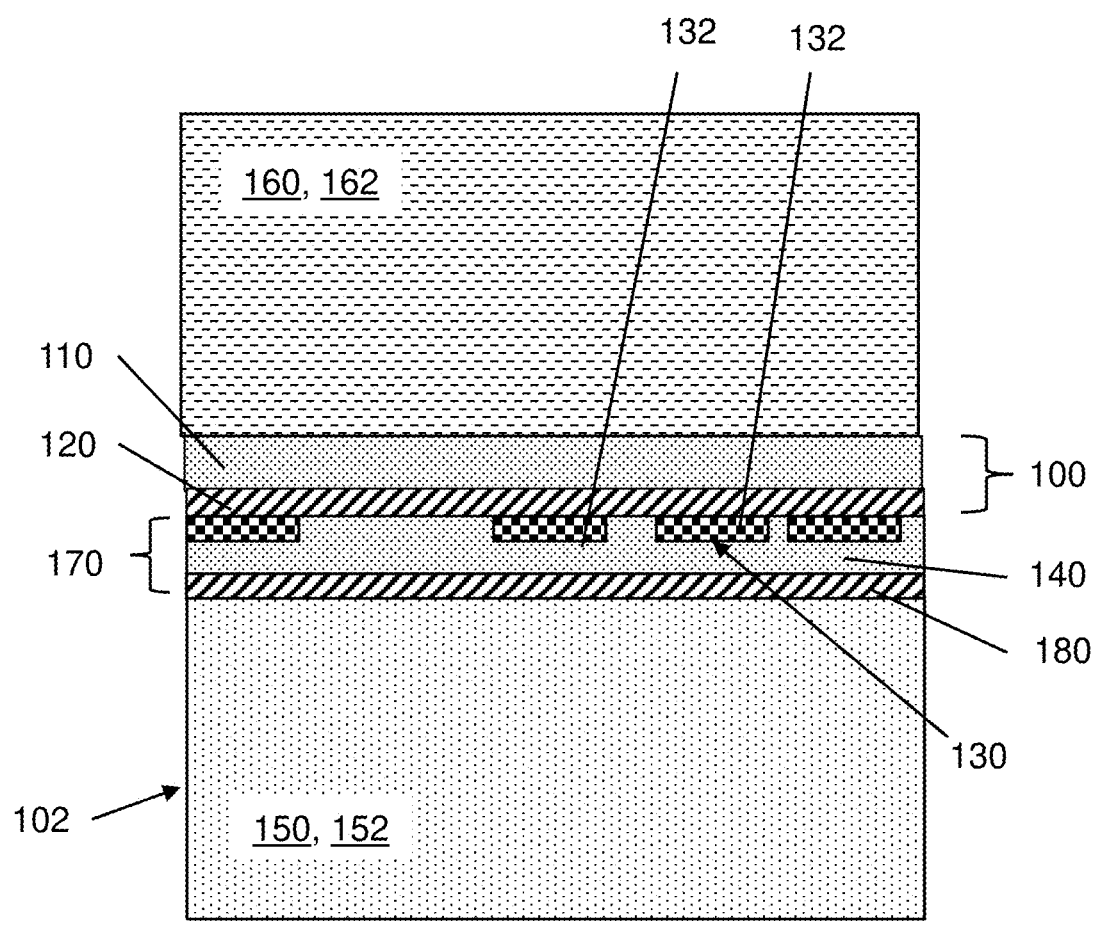
FIG. 10 shows a cross-sectional view of a semiconductor device using first and second bonding structures, according to embodiments of the disclosure.

Returning to FIG. 5 and with reference to FIGS. 8-10, in another embodiment, a second bonding structure 170 (FIG. 8) may be used with first bonding structure 100. FIG. 8 shows forming second bonding structure 170 on second structure 130 (as in FIG. 4). As described relative to FIG. 5, the process includes forming third oxide layer 140 on second structure 130. In contrast to the FIG. 5 embodiment, as shown in FIG. 8, the process may also include forming a fourth oxide layer 180 on third oxide layer 140. Fourth oxide layer 180 is formed as described relative to second oxide layer 120. That is, fourth oxide layer 180 may be formed using, for example, silane-based (SiH$_4$) PECVD, creating a silicon oxide (SiO$_x$). Forming fourth oxide layer 180 uses a higher concentration of the silane than forming first or third oxide layers 110, 140. In addition, a gas ratio of silicon hydride (SiH$_2$) to nitrous oxide (N$_2$O) of the PECVD may be in a range of, for example, 1:20 to 1:25. In any event, the temperature of the PECVD for fourth oxide layer 180 is less than 300° C., which continues to protect any preexisting devices, e.g., IC chips 132 or other devices in first structure 114 from thermally induced damage. Fourth oxide layer 180 may be planarized as described relative to second oxide layer 120, e.g., to a surface RMS roughness in a range of 0.1 to 0.5 nm.

Fourth oxide layer 180 has a higher stress level than third oxide layer 140. For example, in contrast to third oxide layer 140 (and similar to second oxide layer 120), fourth oxide layer 180 may have a relatively high compressive stress in a range of, for example, 300-350 MPa. Fourth oxide layer 180 may also have a higher density than third oxide layer 140. Further, as shown, fourth oxide layer 180 is thinner than third oxide layer 110 (i.e., T3<T4). Fourth oxide layer 180 may be deposited to a thickness in a range of 0.25 to 0.75 μm. Fourth oxide layer 180 deposition can occur at a rate in a range of, for example, 800-1000 Å/min. The duration of depositing fourth oxide layer 180 thus could be longer than that of first and third oxide layers 110, 140 even though layer 180 is thinner than layers 110, 140. When complete, fourth oxide layer 180 may have a density in a range of 2.43-2.52 g/cm$^3$. Fourth oxide layer 180 may have a dielectric constant in a range of, for example, 4.0 to 4.5. Due to the higher stress in fourth oxide layer 180, when fourth oxide layer 180 is used to bond to another structure, a bond strength between fourth oxide layer 180 and that structure is at least 1.0 J/m$^2$. In other embodiments, the bond strength may be at least 1.6 J/m$^2$. The bond strength of second bond structure 170 is thus significantly stronger than that possible with a conventional single thick oxide layer bonding structure, which typically has a bond strength of about 0.6 J/m$^2$. Second bonding structure 170 may include any now known or later developed alignment marks (not shown) for aligning other structure thereto. Hybrid bond pads (not shown), as necessary, may be formed through second bonding structure 170.

As shown in FIG. 8, third structure 150 is bonded to second bonding structure 170, and in particular, fourth oxide layer 180. The bonding may include any now known or later developed process. First structure 112 may then be removed using any now known or later developed technique, which may thin first oxide layer 110.

FIG. 9 shows the structure after rotating second structure 150 to be under first bonding structure 100 (and second bonding structure 170). FIGS. 9 and 10 show bonding a fourth structure 160 to third structure 150 using first bonding structure 100. Here, first oxide layer 110 bonds to fourth structure 160. In the example shown, fourth structure 160 may include a substrate 162, which may include any form of interconnect structures, e.g., metal wires and contacts, etc. The bonding may include any now known or later developed process.

FIG. 10 also shows semiconductor device 102 including second bonding structure 170 for bonding fourth structure 160 to another structure, e.g., IC chips 132 of second structure and/or third structure 150. As noted, second bonding structure 170 includes third oxide layer 140 on structure 150, and fourth oxide layer 180 on third oxide layer 140. As described, fourth oxide layer 180 has a higher density and a higher stress level than third oxide layer 140, and fourth oxide layer 180 is thinner than third oxide layer 140. A bond strength of second bonding structure 170 between fourth oxide layer 180 and structure 150 is at least 1.0 Joules per square meter ($J/m^2$). In other embodiments, the bond strength may be at least 1.6 $J/m^2$.

Referring to FIGS. 11-15, cross-sectional views of alternative embodiments and/or applications of bonding structure(s) 100, 170, are shown. These embodiments include various processes, some of which may be referred to hybrid bond processes in which another device, wafer, or IC chips, are bonded with a direct conductor-to-conductor connection.

Figure 11:
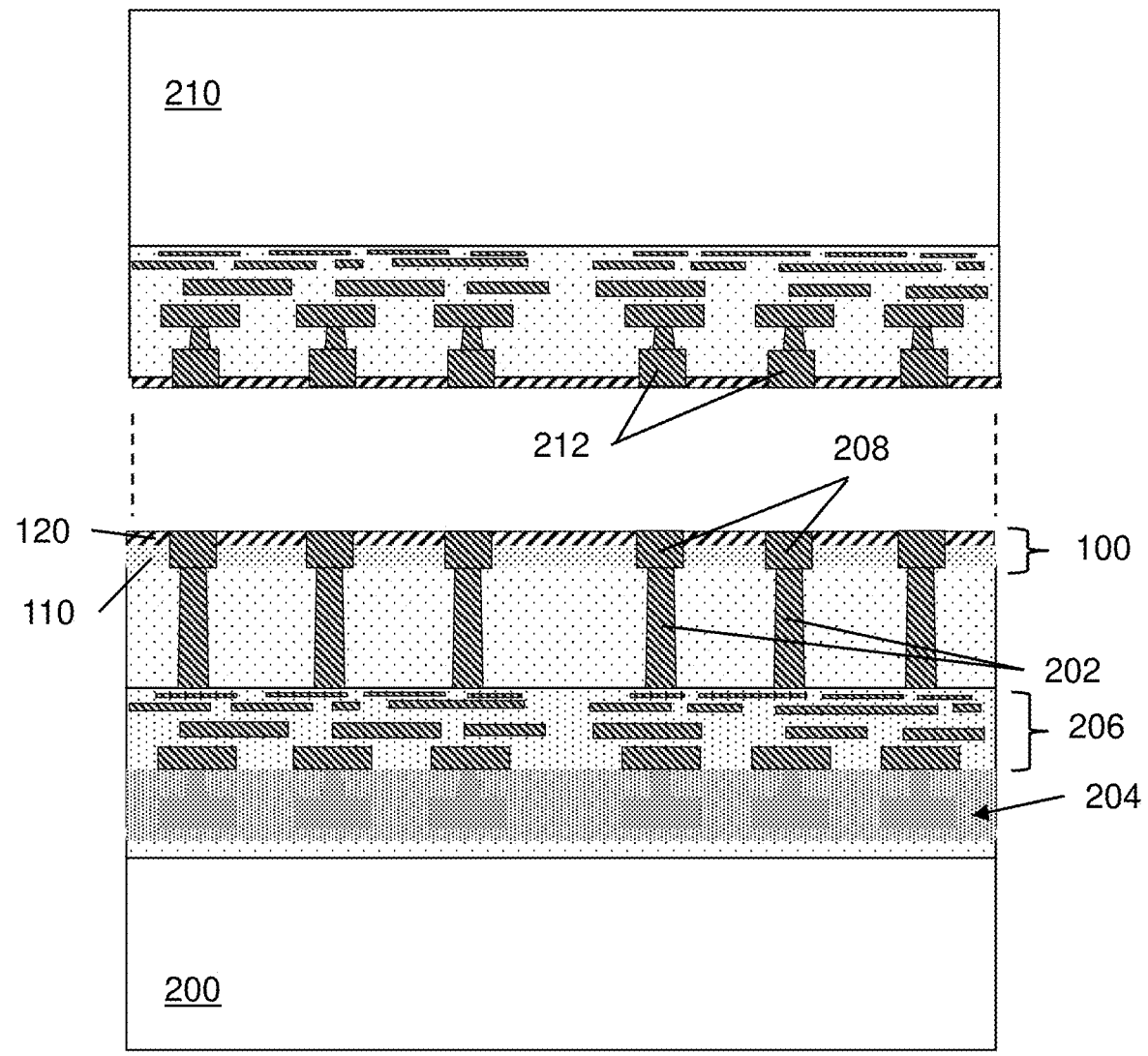
FIG. 11 shows a cross-sectional view of bonding substrates front-to-back using a bonding structure, according to embodiments of the disclosure.

FIG. 11 shows a bonding process similar to that of FIG. 6 with face-to-back wafer-to-wafer hybrid bonding. In FIG. 11, structure 100, including oxide layers 110 and 120, is formed on structure 200 (e.g., a silicon carrier) including through silicon vias (TSVs) 202 on the back side(s) of devices 204 and related interconnect layers 206 therein. Oxide layers 110, 120 may be formed as described herein after TSV 202 reveal using, for example, a grinding, etch and planarization process. Hybrid bond pads 208 would then be formed on TSVs 202 in any now known or later developed manner, e.g., single copper damascene process and planarization. Structure 200 would then be bonded to a front side of another structure 210 including similar, aligned hybrid bond pads 212. Hybrid bond pads 208, 212 form a direct conductor-to-conductor (e.g., Cu-Cu) hybrid bond in a known fashion. Bond structure 100, however, provides a stronger bond strength between structures 200, 210, as described herein. While shown on only one structure 200, bond structure 100 may be formed on both structures 200, 210.

Figure 12:
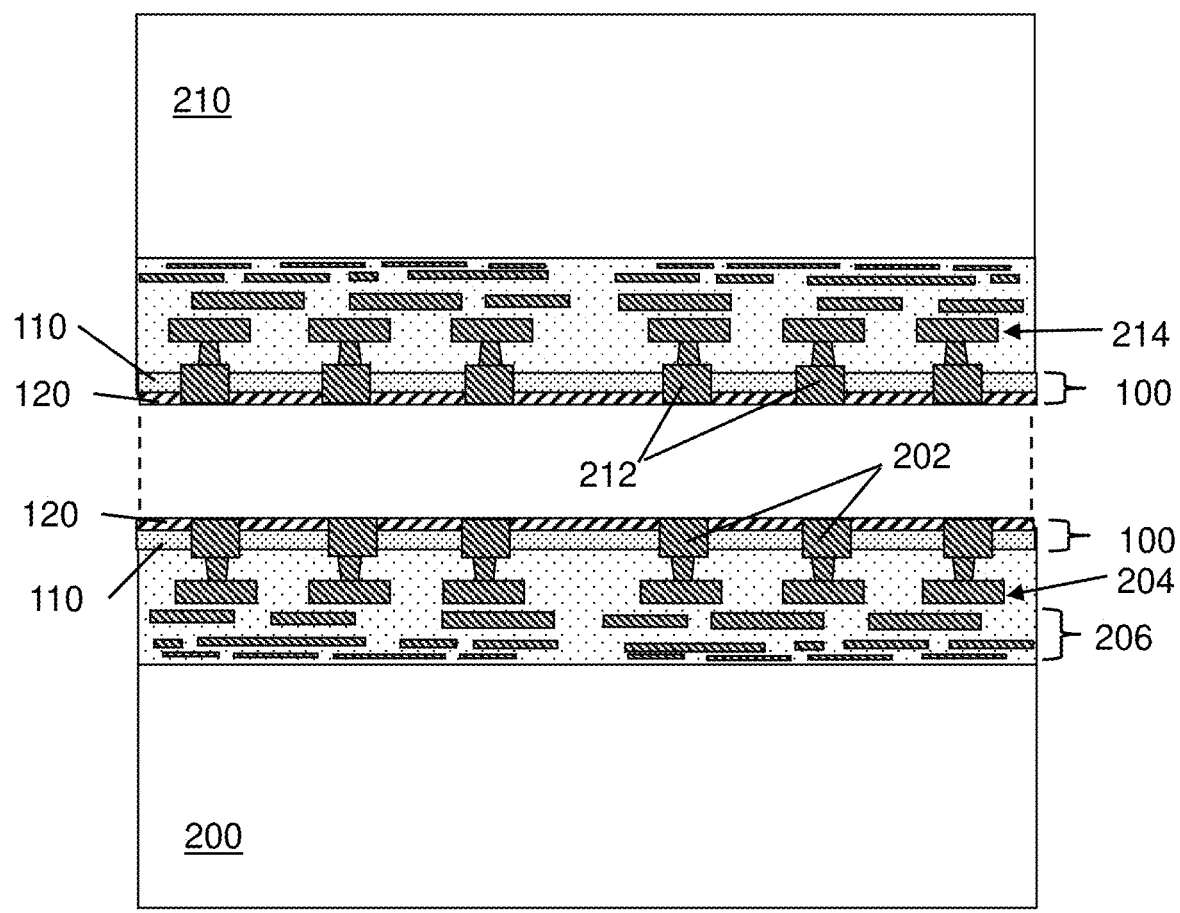
FIG. 12 shows a cross-sectional view of bonding substrates front-to-front using bonding structures, according to embodiments of the disclosure.

FIG. 12 shows a bonding process similar to that of FIG. 11 but with face-to-face wafer-to-wafer hybrid bonding. Each structure 200, 210 includes hybrid bond pads 202, 212 on a front side of devices 204, 214. In this case, oxide layers 110, 120 may be formed as described herein on front side of structures 200, 210, i.e., prior to hybrid bond pad formation. Hybrid bond pads 202, 212 would then be formed in the respective structures 200, 210 in any now known or later developed manner, e.g., a dual copper damascene process to connect to devices 204, 214 with a subsequent planarization. A front side of structure 200 may be bonded to the front side of structure 210 using aligned hybrid bond pads 202, 212. Hybrid bond pads 202, 212 form a direct conductor-to-conductor (e.g., Cu-Cu) hybrid bond in a known fashion. Bond structure 100, however, provides a stronger bond strength between structures 200, 210, as described herein. While shown on both structures 200, 210, bond structure 100 may be formed on just one of structures 200, 210.

Figure 13:
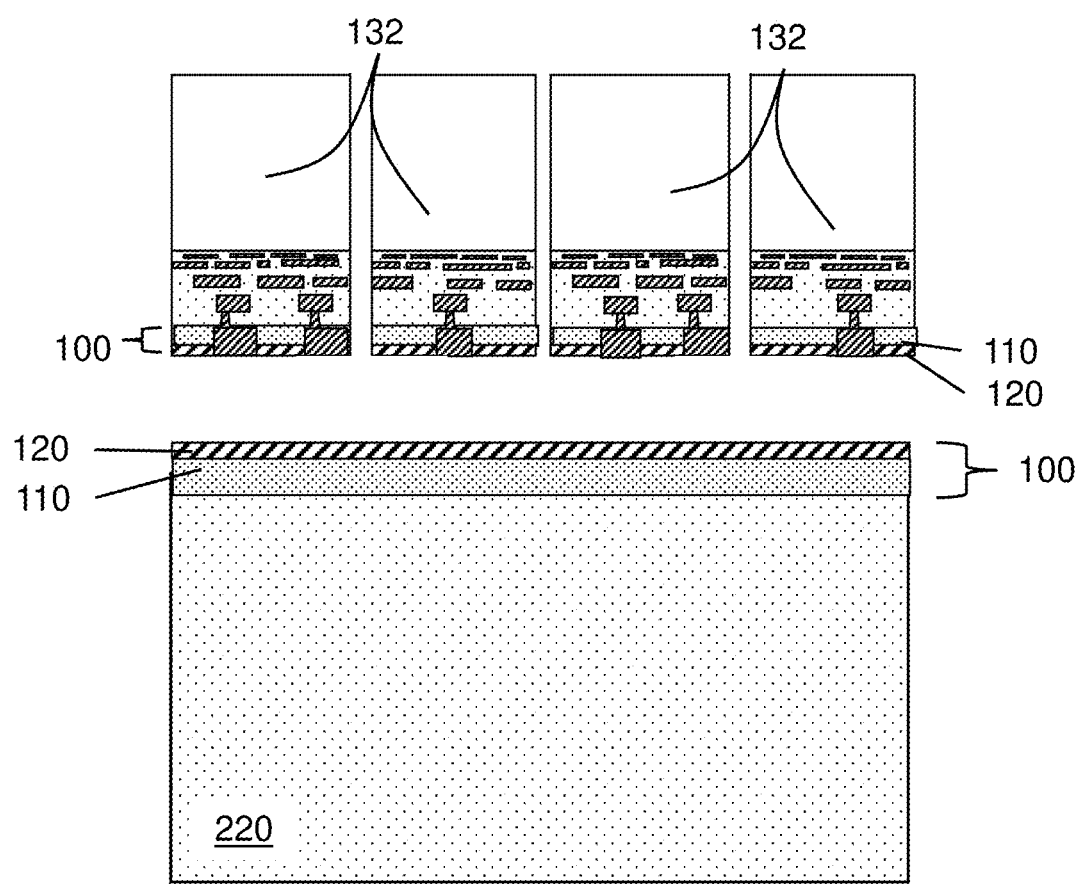
FIG. 13 shows a cross-sectional view of bonding IC chips to a carrier wafer using a bonding structure, according to embodiments of the disclosure.
Figure 14:
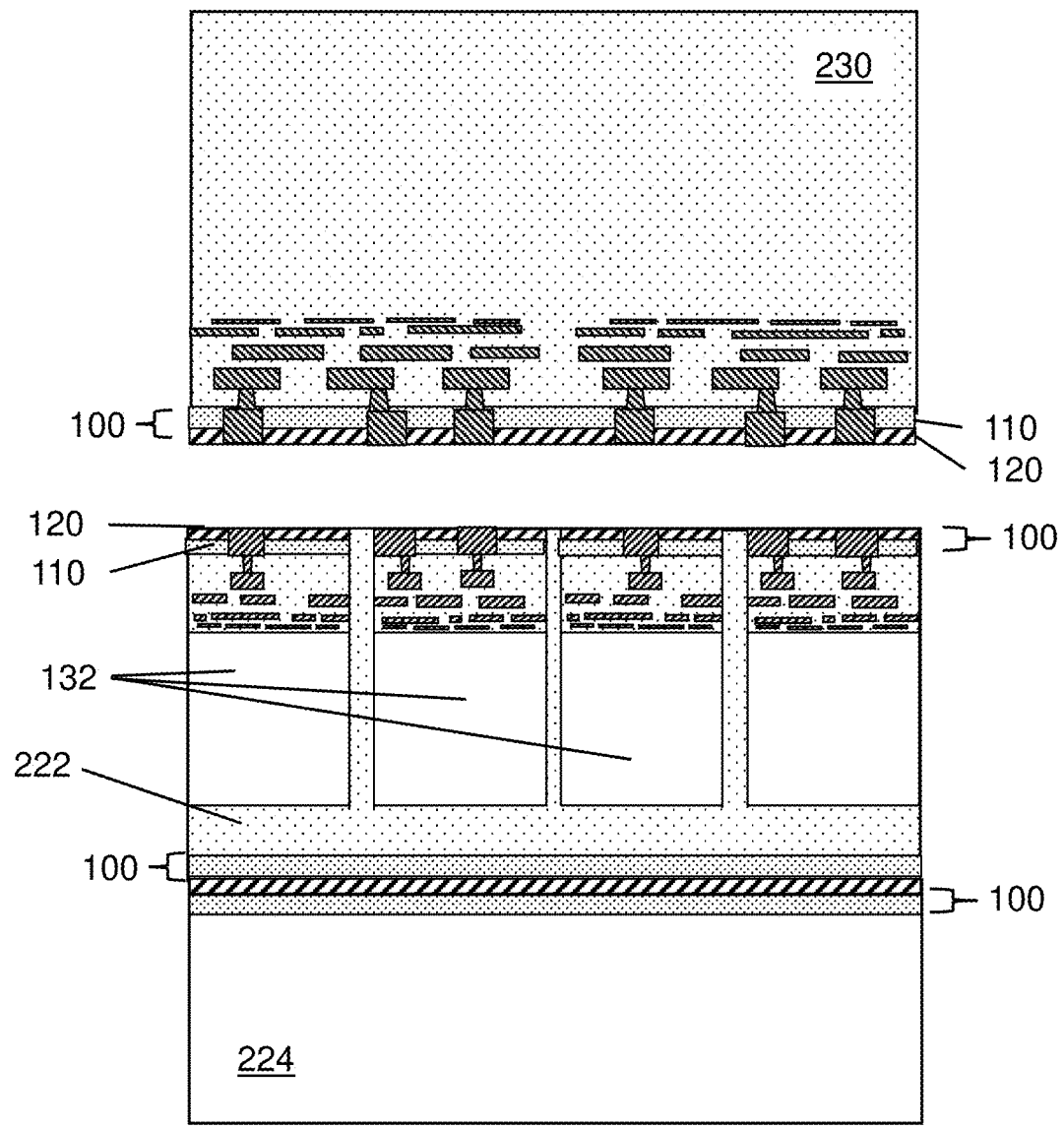
FIG. 14 shows a cross-sectional view of bonding the IC chips of FIG. 13 front-to-front to another wafer using bonding structures, according to embodiments of the disclosure.
Figure 15:
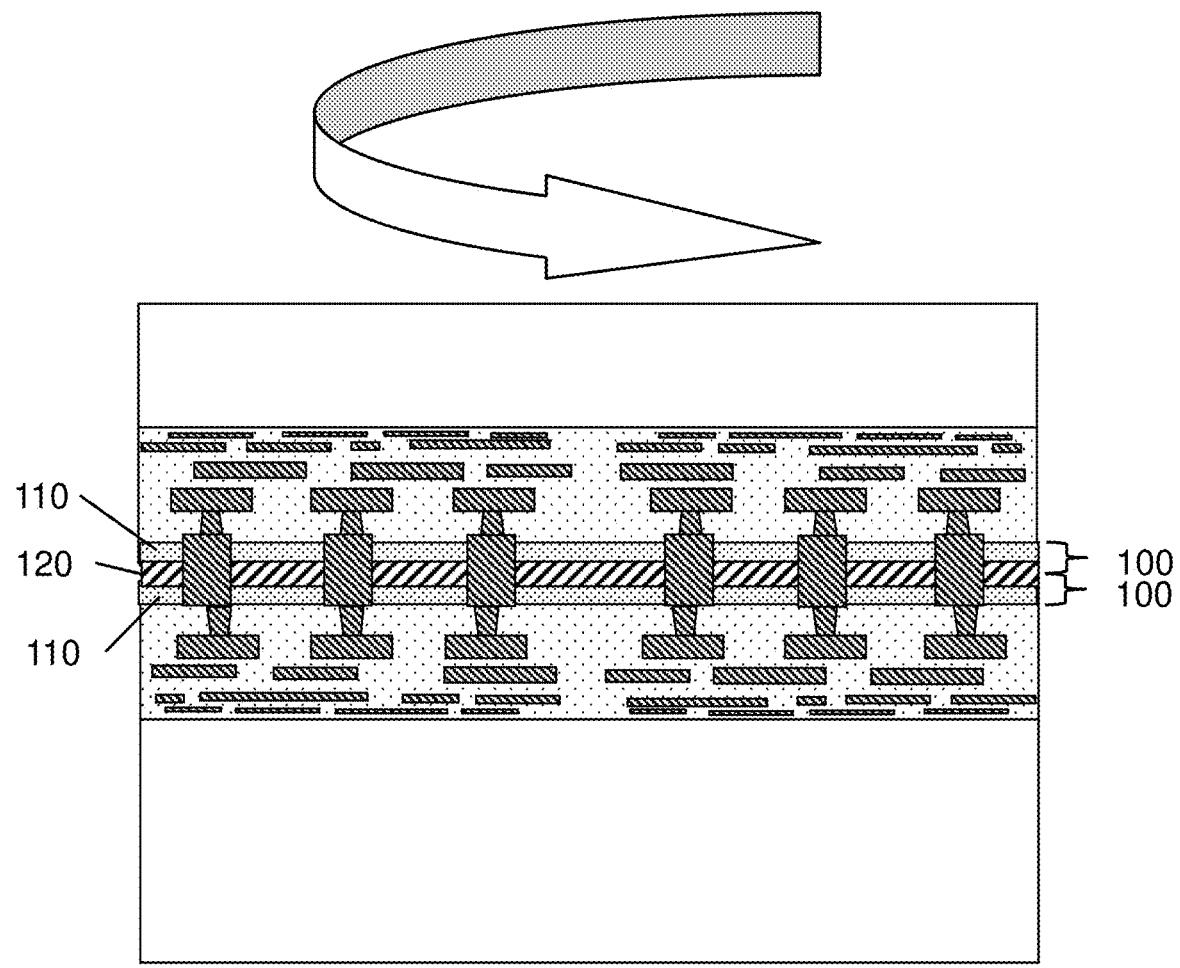
FIG. 15 shows a cross-sectional view of thinning a substrate after bonding using a bonding structure(s), according to embodiments of the disclosure.

FIGS. 13-14 show cross-sectional views of another application. In this application, as shown in FIG. 13, IC chips 132 may be prepared with bonding structure 100 thereon, and singulated. IC chips 132 may be taken from separate wafers with different IC structure and functions, for example, logic and memory chips or IC chips 132 may be taken from different IP nodes. IC chips 132 may be tested and determined as "Known Good Dies" with high yield prior to bonding the IC chips from different sources onto a carrier wafer 220. IC chips 132 are fusion bonded onto a first carrier wafer 220, which also includes bonding structure 100. As shown in FIG. 14, IC chips 132 are encapsulated in a dielectric layer 222, and collectively removed from first carrier wafer 220 (FIG. 13). IC chips 132 are then fusion bonded to a second carrier wafer 224. Second carrier wafer 224 may also include bonding structure(s) 100. The structures shown in FIG. 15 are then fusion bonded face-to-face using bonding structures 100 to another structure 230 including interconnects therein, e.g., metal wires and vias. Bonding structure(s) 100 has/have sufficient bond strength to prevent disconnection of the structures.

Figure 16:
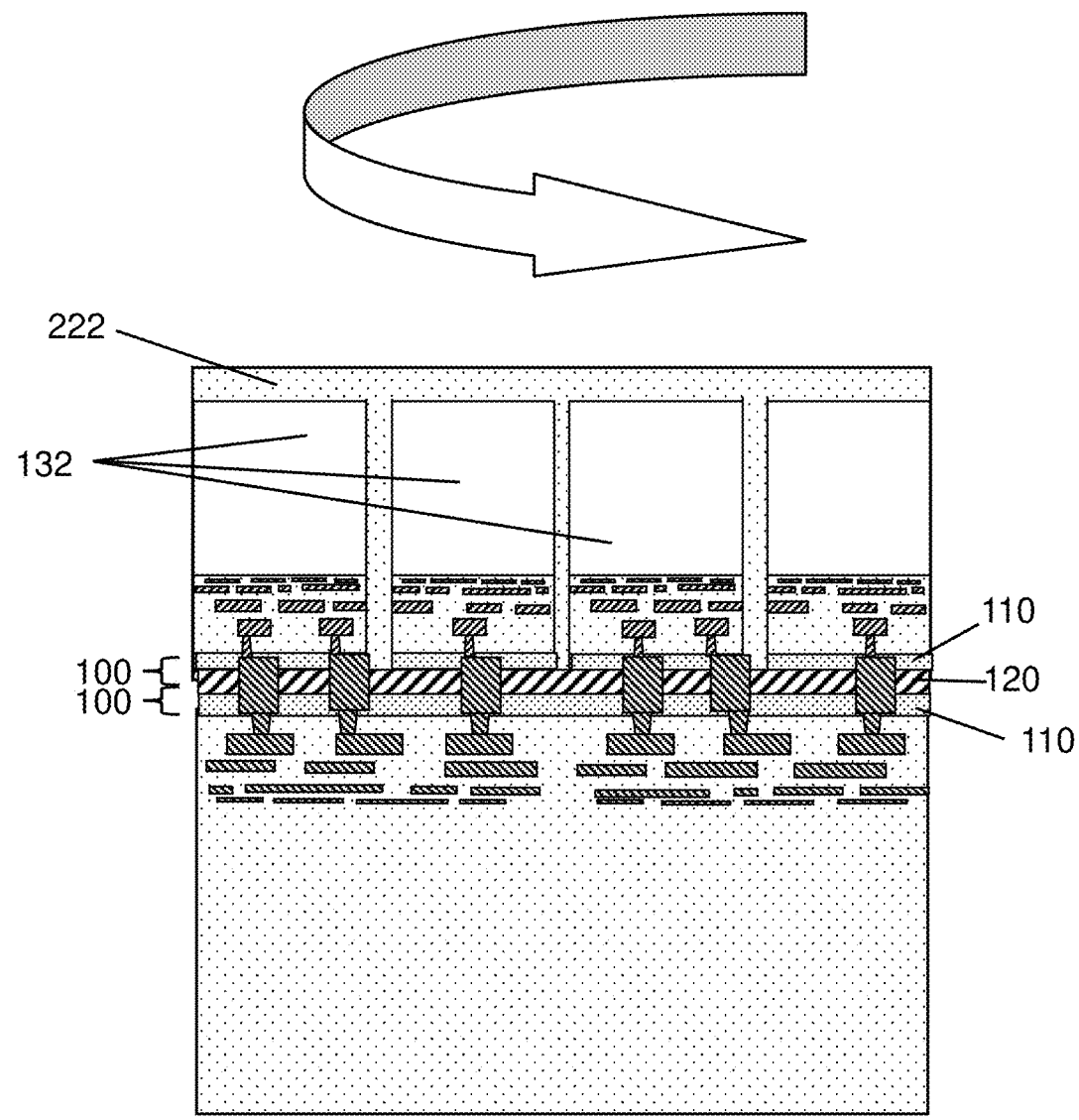
FIG. 16 shows a cross-sectional view of a semiconductor bonding structure(s), according to other embodiments of the disclosure.

FIGS. 15 and 16 show cross-sectional views of thinning structures, such as semiconductor substrates, using, for example, planarization (curved arrow). FIG. 15 shows thinning of the FIG. 12 embodiment, and FIG. 16 shows thinning of the FIG. 14 embodiment. In either case, bond structure(s) 100 provided improved bond strength to withstand the planarization process.

Embodiments of the disclosure provide various technical and commercial advantages, examples of which are discussed herein. One or more of the bonding structures 100, 170 can be used in a single device. The bonding structure(s) 100, 170 provide a greater bond strength than just a thick oxide layer, e.g., at least 1.0 Joules per square meter ($J/m^2$) compared to about 0.6 $J/m^2$. In other embodiments, the bond strength may be at least 1.6 $J/m^2$. In addition, the bonding structure(s) 100, 170 are free of voids therein. The process to form bonding structure(s) 100, 170 does not require tool modifications, and any oxide forming steps use low temperatures that do not damage pre-existing devices.

The method as described above is used in the fabrication and packaging of integrated circuit chips. The package may be part of either (a) an intermediate product, such as a motherboard, or (b) an end product. The end product can be any product that includes integrated circuit chips, ranging from toys and other low-end applications to advanced computer products having a display, a keyboard or other input device, and a central processor. End products can also include mobile displays and other microLED products as well as RF chips, and related mobile displays.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bonding structure for a semiconductor substrate, the bonding structure comprising:
   a first oxide layer on the semiconductor substrate; and
   a second oxide layer on the first oxide layer, the second oxide layer for bonding to another structure,
   wherein the second oxide layer has a higher stress level than the first oxide layer, and the second oxide layer is thinner than the first oxide layer.

2. The bonding structure of claim 1, wherein the second oxide layer has a higher density than the first oxide layer.

3. A semiconductor device, comprising:
   a semiconductor substrate; and
   a first bonding structure between the semiconductor substrate and a first structure, the first bonding structure including:
      a first oxide layer on the semiconductor substrate, and
      a second oxide layer on the first oxide layer coupled to the first structure;
      wherein the second oxide layer has a higher stress level than the first oxide layer, and the second oxide layer is thinner than the first oxide layer.

4. The semiconductor device of claim 3, wherein the second oxide layer has a higher density than the first oxide layer.

5. The semiconductor device of claim 4, wherein the first oxide layer has a density in a range of 2.31-2.37 grams per cubic centimeter ($g/cm^3$), and the second oxide layer has a density in a range of 2.43-2.52 $g/cm^3$.

6. The semiconductor device of claim 3, further comprising a second bonding structure for bonding a second structure to the first structure, wherein the second bonding structure includes:
   a third oxide layer on the first structure, and
   a fourth oxide layer on the third oxide layer,
   wherein the fourth oxide layer has a higher density and a higher stress level than the third oxide layer, and the fourth oxide layer is thinner than the third oxide layer.

7. The semiconductor device of claim 3, wherein the first oxide layer has a thickness in a range of 5000 to 15000 nanometers (nm), and the second oxide layer has a thickness in a range of 250 to 750 nm.

8. The semiconductor device of claim 3, wherein the first oxide layer has a compressive stress in a range of 70-100 MegaPascals (MPa), and the second oxide layer has a compressive stress in a range of 300-350 MPa.

9. The semiconductor device of claim 3, wherein at least one of the first oxide layer and the second oxide layer has a surface having a root mean square roughness in a range of 0.1 to 0.5 nanometers.

10. The semiconductor device of claim 3, wherein a bond strength between the second oxide layer and the first structure is at least 1.0 Joules per square meter ($J/m^2$).

11. A method, comprising:
    forming a first bonding structure, the forming including:
       forming a first oxide layer on a first structure;
       forming a second oxide layer on the first oxide layer, wherein the second oxide layer has a higher stress level than the first oxide layer, and the second oxide layer is thinner than the first oxide layer; and
    bonding the second oxide layer to a second structure.

12. The method of claim 11, wherein the second oxide layer has a higher density than the first oxide layer.

13. The method of claim 12, wherein the first oxide layer has a density in a range of 2.31-2.37 grams per cubic centimeter ($g/cm^3$), and the second oxide layer has a density in a range of 2.43-2.52 $g/cm^3$.

14. The method of claim 11, wherein forming the first oxide layer and forming the second oxide layer each occur at a temperature of less than 300° Celsius (° C.).

15. The method of claim 11, wherein forming the first oxide layer includes depositing the first oxide layer to a thickness in a range of 5000 to 15000 nanometers (nm), and wherein forming the second oxide layer includes depositing the second oxide layer to a thickness in a range of 250 to 750 nm.

16. The method of claim 11, wherein the first oxide layer has a compressive stress in a range of 70-100 MegaPascals (MPa), and the second oxide layer has a compressive stress in a range of 300-350 MPa.

17. The method of claim 11, wherein at least one of forming the first oxide layer and forming the second oxide layer includes planarizing a surface of the respective oxide layer to have a root mean square roughness in a range of 0.1 to 0.5 nanometers.

18. The method of claim 11, wherein a bond strength between the second oxide layer and the first structure is at least 1.0 Joules per square meter ($J/m^2$).

19. The method of claim 11, further comprising:
    forming a second bonding structure on the second structure, including:
       forming a third oxide layer on the second structure, and
       forming a fourth oxide layer on the third oxide layer,
       wherein the fourth oxide layer has a higher density and a higher stress level than the third oxide layer, and the fourth oxide layer is thinner than the third oxide layer; and
    bonding a third structure to the fourth oxide layer.

20. The method of claim 19, wherein forming the third oxide layer includes depositing the third oxide layer to a thickness in a range of 5000 to 15000 nanometers (nm), and forming the fourth oxide layer includes depositing the fourth oxide layer to a thickness in a range of 250 to 750 nm.

* * * * *